United States Patent
Koizumi et al.

(10) Patent No.: US 6,977,133 B2
(45) Date of Patent: Dec. 20, 2005

(54) PHOTOMASK AND PATTERN FORMING METHOD

(75) Inventors: Taichi Koizumi, Osaka (JP); Akio Misaka, Osaka (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 230 days.

(21) Appl. No.: 10/390,948

(22) Filed: Mar. 17, 2003

(65) Prior Publication Data
US 2003/0199124 A1 Oct. 23, 2003

(30) Foreign Application Priority Data
Mar. 20, 2002 (JP) ............................. 2002-079046

(51) Int. Cl.$^7$ ............................................. G03C 5/00
(52) U.S. Cl. ........................................................ 430/311
(58) Field of Search ......................... 430/5, 311, 312; 355/53, 77; 250/492.2, 492.22

(56) References Cited

U.S. PATENT DOCUMENTS 6,638,664 B2 * 10/2003 Hsieh et al. ................... 430/5

FOREIGN PATENT DOCUMENTS

| JP | 3-89347 | 4/1991 |
|---|---|---|
| JP | 5-67550 | 3/1993 |
| JP | 2002-6475 | 1/2002 |

* cited by examiner

*Primary Examiner*—S. Rosasco
(74) *Attorney, Agent, or Firm*—Hamre, Schumann, Mueller & Larson, P.C.

(57) ABSTRACT

A photomask is used for transferring a mask pattern onto a semiconductor substrate. The mask pattern includes a junction at which two line patterns are connected to each other with one line pattern being orthogonal to the other line pattern so as to form a T-shape, or a proximity portion at which two line patterns are located close to each other with one line pattern being substantially orthogonal to the other line pattern so as to form a T-shape. A small pattern is formed on a side edge of the line pattern in the vicinity of the junction or the proximity portion so as to form a wide portion of the line pattern. The small pattern is provided within the range between 0.79 and 1.8 $\lambda/(NA \cdot K)$ of a distance from the neighboring side edge of the other line pattern, where $\lambda$ is the wavelength of exposure illumination light, NA is the numerical aperture of a lens used, and K is a transfer reduction ratio.

2 Claims, 6 Drawing Sheets

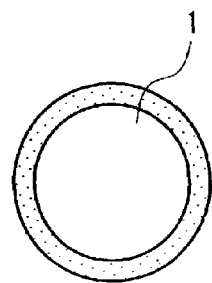
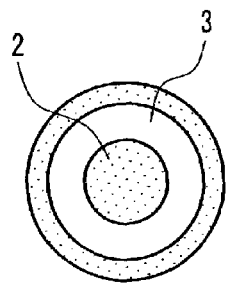
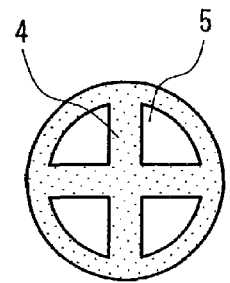
FIG. 1A   FIG. 1B   FIG. 1C
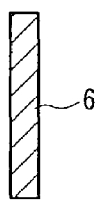
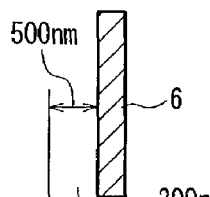
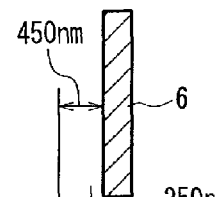
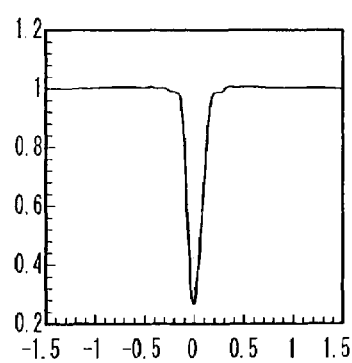
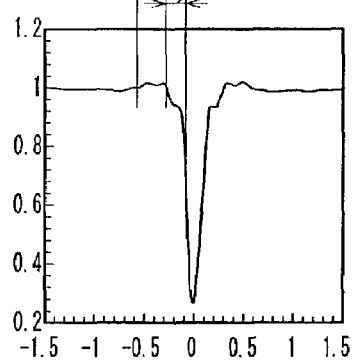
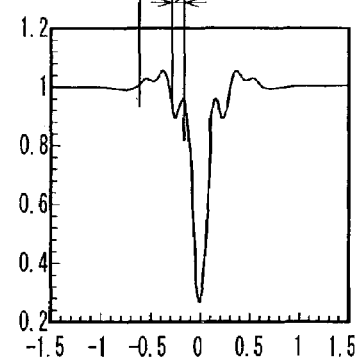
FIG. 2A   FIG. 2B   FIG. 2C

PHOTOMASK AND PATTERN FORMING METHOD

BACKGROUND OF THE INVENTION

1. Field of the Invention

The present invention relates to a photomask and a pattern forming method.

2. Description of the Related Art

With the recent progress in miniaturization of semiconductor devices, the semiconductor devices with 50 to 150 nm design rules have been developed. A photolithography process in the manufacture of a semiconductor device uses light in the near-ultraviolet or ultraviolet region as an exposure light source, e.g., G-rays (wavelength: 436 nm), i-rays (wavelength: 365 nm), a KrF excimer laser (wavelength: 248 nm), an ArF excimer laser (wavelength: 193 nm), or an F2 laser (wavelength: 156 nm). At present, a KrF excimer laser beam or ArF excimer laser beam is used to form a resist pattern having a smaller line width on a semiconductor substrate.

An exposure technique that uses such high-energy light with off-axis illumination, a phase shift mask, etc. is generally known as a super-resolution technique. The off-axis illumination can be incorporated easily into a conventional exposure apparatus and provide a high degree of freedom in the pattern layout design of a circuit. Therefore, it is often used for transferring a pattern with a line width of 50 to 150 nm.

When the line width of a resist pattern formed by transfer is about one-half the wavelength of exposure light in the super-resolution technique, it is difficult to ensure sufficient resolution and exposure margin by so-called ½ annular illumination. Thus, ⅔ annular illumination or quadrupole illumination has been employed recently.

However, the super-resolution techniques such as ⅔ annular illumination and quadrupole illumination have the following problem. For example, when a mask including a mask pattern of two line patterns 20, 21 intersecting to form a T-shape (FIG. 9) is used and the mask pattern is transferred onto a semiconductor substrate, constrictions 22 are generated in part of a resist pattern (FIG. 10). These constrictions 22 may cause disconnection during manufacture of a semiconductor device.

JP 5(1993)-67550 A discloses a technique to solve the similar problems. When a large pattern branches out into fine line patterns, a resist pattern corresponding to the fine line pattern tends to be constricted in the branch portion. To eliminate the constriction, this technique uses a mask in which a small pattern of resolution limit or less is arranged on both sides of a submicron width mask pattern at the position 0.4 to 0.75 $\lambda/(NA \cdot K)$ away from the junction between wirings. Here, $\lambda$ is the wavelength of exposure light, NA is the numerical aperture of a lens used, and K is a lens reduction ratio.

However, this conventional technique is not available for the transfer of a fine circuit pattern having a line width of 50 to 150 nm by the super-resolution technique. Although there is a similarity of the phenomena of constriction to be generated in part of a resist pattern, the mechanism of the constriction is different due to, e.g., a difference in exposure illumination, as will be described later. Therefore, the technique disclosed in JP 5(1993)-67550 A cannot eliminate the constrictions 22 shown in FIG. 10.

SUMMARY OF THE INVENTION

Therefore, with the foregoing in mind, it is an object of the present invention to provide a photomask and a pattern forming method that can form a resist pattern having a line width with reduced constriction on a semiconductor substrate easily and stably, thus conforming to the recent microfabrication technology of semiconductor devices.

A photomask of the present invention is used for transferring a mask pattern onto a semiconductor substrate. The photomask includes a junction at which two line patterns are connected to each other with one line pattern being orthogonal to the other line pattern so as to form a T-shape, or a proximity portion at which two line patterns are located close to each other with one line pattern being substantially orthogonal to the other line pattern so as to form a T-shape. A small pattern is formed on a side edge of the line pattern in the vicinity of the junction or the proximity portion so as to form a wide portion of the line pattern. The small pattern is provided within the range between 0.79 and 1.8 $\lambda/(NA \cdot K)$ of a distance from the neighboring side edge of the other line pattern, where $\lambda$ is the wavelength of exposure illumination light, NA is the numerical aperture of a lens used, and K is a transfer reduction ratio.

A method for forming a resist pattern on a semiconductor substrate of the present invention uses a photomask having a mask pattern that includes a junction at which two line patterns are connected to each other with one line pattern being orthogonal to the other line pattern so as to form a T-shape, or a proximity portion at which two line patterns are located close to each other with one line pattern being substantially orthogonal to the other line pattern so as to form a T-shape. A small pattern is formed on a side edge of the line pattern in the vicinity of the junction or the proximity portion so as to form a wide portion of the line pattern. The small pattern is provided within a range between 0.79 and 1.8 $\lambda/(NA \cdot K)$ of a distance from the neighboring side edge of the other line pattern, where $\lambda$ is the wavelength of exposure illumination light, NA is the numerical aperture of a lens used, and K is a transfer reduction ratio. The mask pattern of the photomask is transferred onto a photoresist on the semiconductor substrate with the transfer reduction ratio K ranging from ⅕ to ¼, and the photomask is irradiated with off-axis illumination light during the transfer of the mask pattern.

According to these configurations, a resist pattern with uniform line width can be formed on a semiconductor substrate easily and stably, thus achieving the precise manufacture of a semiconductor device having, e.g., a microstructure of 50 to 150 nm design rules.

BRIEF DESCRIPTION OF THE DRAWINGS

FIGS. 1A to 1C are plan views showing the shapes of different light sources, respectively.

FIGS. 2A to 2C show the results of simulation performed by exposing a line pattern with the light sources in FIGS. 1A to 1C, respectively.

DESCRIPTION OF THE PREFERRED EMBODIMENTS

Figure 3A:
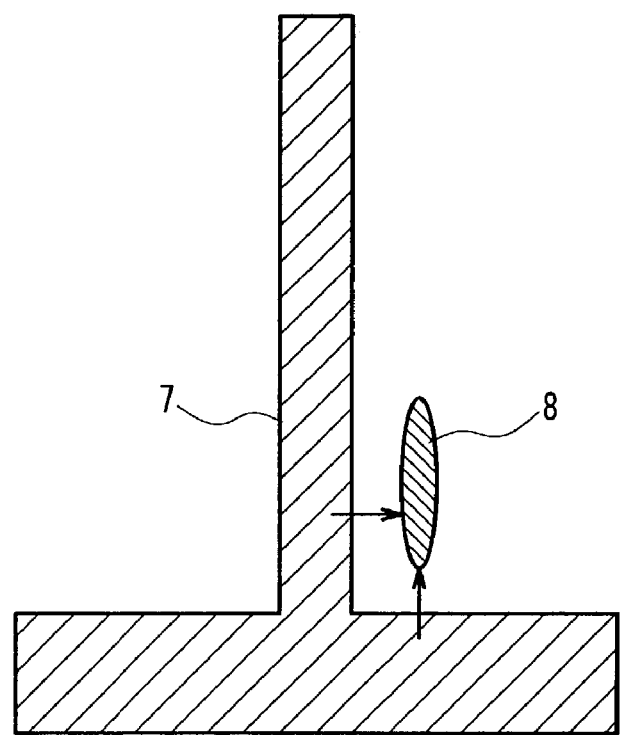
FIG. 3A shows light intensity when a T-shaped pattern is exposed with quadrupole illumination.

The experiments conducted by the present inventors revealed that a unique phenomenon occurs when off-axis illumination is applied to a T-shaped pattern. Before describing embodiments of the present invention, this phenomenon will be explained. Referring to FIGS. 1A to 1C and FIGS. 2A to 2C, the results of simulation performed by exposing a line pattern with different light sources will be described.

FIGS. 1A to 1C show different light sources. FIG. 1A illustrates a normal light source that includes a circular irradiation region 1 and produces circular light for the irradiation of a photomask. FIG. 1B illustrates an annular illumination light source that includes a light-shielding region 2 in the center and an annular irradiation region 3. An annular ratio is defined as r/R where r is a diameter of the light-shielding region 2 and R is an outer diameter of the irradiation region 3. FIG. 1C illustrates a quadrupole illumination light source that includes a cross-shaped light-shielding region 4 and four irradiation regions 5 that are arranged diagonally on X-Y coordinates.

FIGS. 2A to 2C show the results of simulating the distribution of light intensity on a wafer when a mask pattern 6 having a line width of 80 nm is exposed by using the light sources in FIGS. 1A to 1C, respectively. The simulation was performed under the conditions of a light source wavelength $\lambda=193$ nm and a numerical aperture NA=0.7. In the graphs of FIGS. 2A to 2C, the horizontal axis indicates a distance from the centerline of the mask pattern 6, and the vertical axis indicates the light intensity. A value 1 of the light intensity in these graphs corresponds to a value of the light intensity on a wafer resulting from the exposure of a sufficiently large area including no mask pattern.

Compared with a light intensity distribution of FIG. 2A obtained by using the normal light source of FIG. 1A, it is clear that in a light intensity distribution of FIG. 2B obtained by using the annular illumination light source of FIG. 1B, a portion with a light intensity of more than 1 exists in a region of 300 nm to 500 nm distant from the line edge. That is, an extraordinarily high light intensity is generated in this region due to the interference effect of diffracted light. Similarly, for the quadrupole illumination light of FIG. 1C, an extraordinarily high light intensity is generated in a region of 250 nm to 450 nm distant from the line edge, as shown in FIG. 2C.

Unlike an exposure by the normal light source, the diffracted light is not averaged in an exposure of the off-axis illumination such as annular illumination and quadrupole illumination, but a portion of the diffracted light is emphasized instead. Therefore, the generation of an extraordinarily high light intensity region is attributed to the interference effect of the diffracted light as described above. However, such generation of the extraordinarily high light intensity region is considered to have no effect on pattern formation, as long as it causes the light intensity more than a critical value of resist sensitivity at a region to be exposed. That is, when the extraordinarily high light intensity region is generated around the pattern and is analogous to the pattern in shape, as shown in FIGS. 2A to 2C, it is not a problem.

FIG. 3A shows the results of simulating the exposure of a T-shaped pattern. A region 7 corresponds to the T-shaped pattern. Light beams traveling from two different directions are superimposed in the vicinity of the region 7 to generate a region 8 with an extraordinarily high light intensity. The above phenomenon cannot be ignored in the case of the region 8. When an extraordinarily high light intensity region is generated around the pattern and is not analogous to the pattern in shape, the light of this region may affect the distribution of the light intensity in a region contributing to pattern formation where the light intensity should be less than a critical value of resist sensitivity.

Figure 3B:
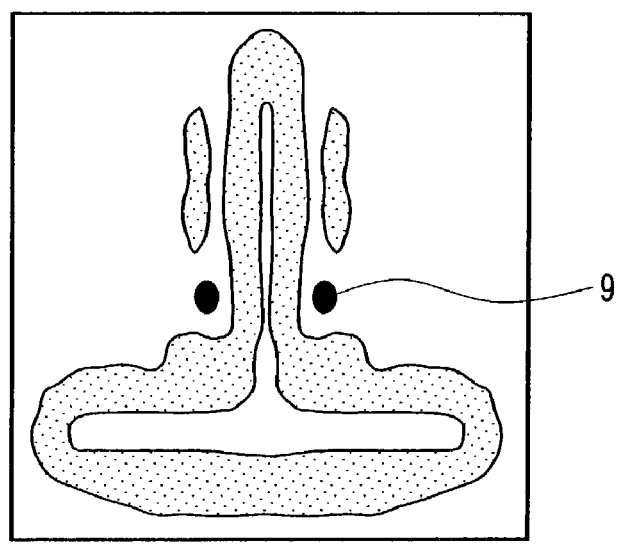
FIG. 3B shows two-dimensional light intensity distribution when a T-shaped pattern is exposed with quadrupole illumination.

FIG. 3B shows two-dimensional light intensity distribution when a T-shaped pattern actually is exposed with quadrupole illumination. In FIG. 3B, the dotted portion represents high light intensity A region 9 is generated at a position away from the base of the T-shape by the superimposition of light intensity according to both horizontal and vertical patterns. This indicates the influence on the light intensity distribution in a region contributing to pattern formation. These extraordinarily high light intensity regions are generated due to diffraction as described above. Therefore, the portion where pattern distortion occurs can be predicted by determining the dimension based on $\lambda/NA$ so that different illumination wavelength and NA are generalized.

In view of the above description, a photomask of the present invention includes a junction or proximity portion of two line patterns, and a small pattern is formed on a side edge of the line pattern in the vicinity of the junction or the proximity portion so as to form a wide portion of the line pattern. The small pattern is provided within the range between 0.79 and 1.8 $\lambda/(NA \cdot K)$ of a distance from the neighboring side edge of the other line pattern. It is preferable that the amount of protrusion at the wide portion measured from the side edge of the mask pattern having a line width W is not less than 0.05 W, where W is defined as a line width that is determined according to a desired line width of a resist pattern to be formed on the semiconductor substrate. It is preferable that the amount of protrusion is not more than 0.3 W. It is preferable that the small pattern is formed within a distance of 0.79 to 1.55 $\lambda/(NA \cdot K)$. The line width of the wide portion can be made uniform, or be larger in the middle than on both sides thereof in the length direction of the line pattern. The transfer reduction ratio K may be in the range of 1/5 to 1/4.

A method for forming a resist pattern of the present invention includes using the above photomask, and transferring a mask pattern of the photomask onto a semiconductor substrate with the transfer reduction ratio K of 1/5 to 1/4 while irradiating the photomask with off-axis illumination light. It is preferable that annular light with an annular ratio of not more than 2/3 or quadrupole light is used as the *off-axis illumination light*. It is preferable that a circuit pattern formed on the semiconductor substrate has a line width of 50 nm to 150 nm.

Hereinafter, embodiments of the present invention will be described with reference to the drawings.

Embodiment 1

Figure 4A:
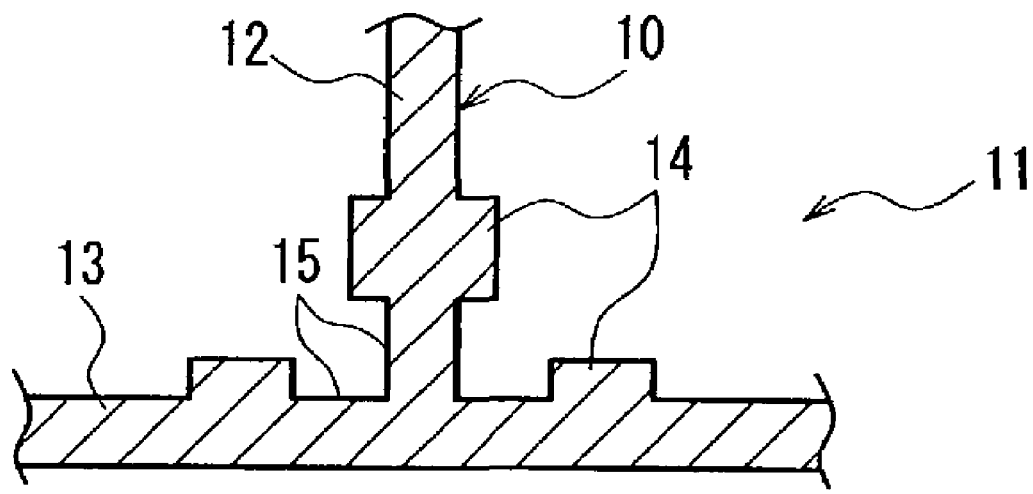
FIGS. 4A and 4B are plan views, each showing pattern data used for producing a photomask according to Embodiment 1.
Figure 4B:
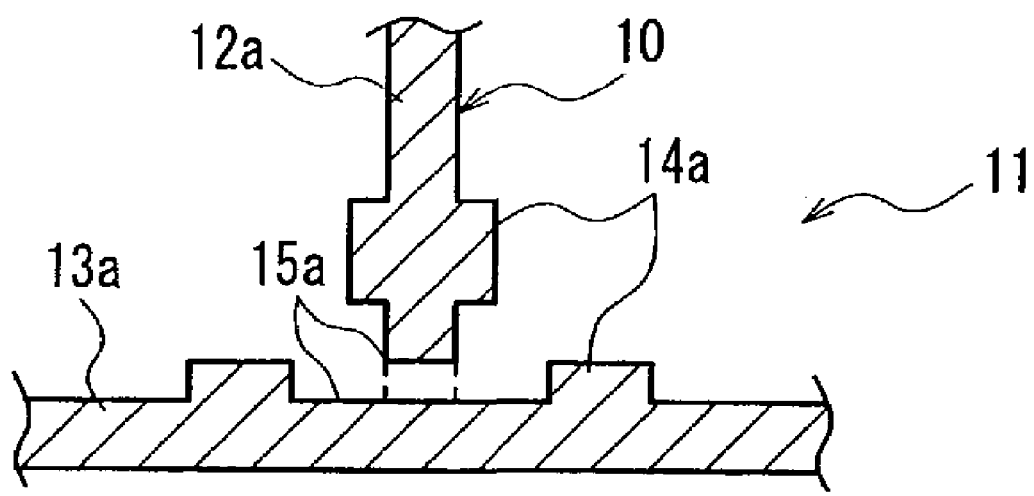
Figure 5A:
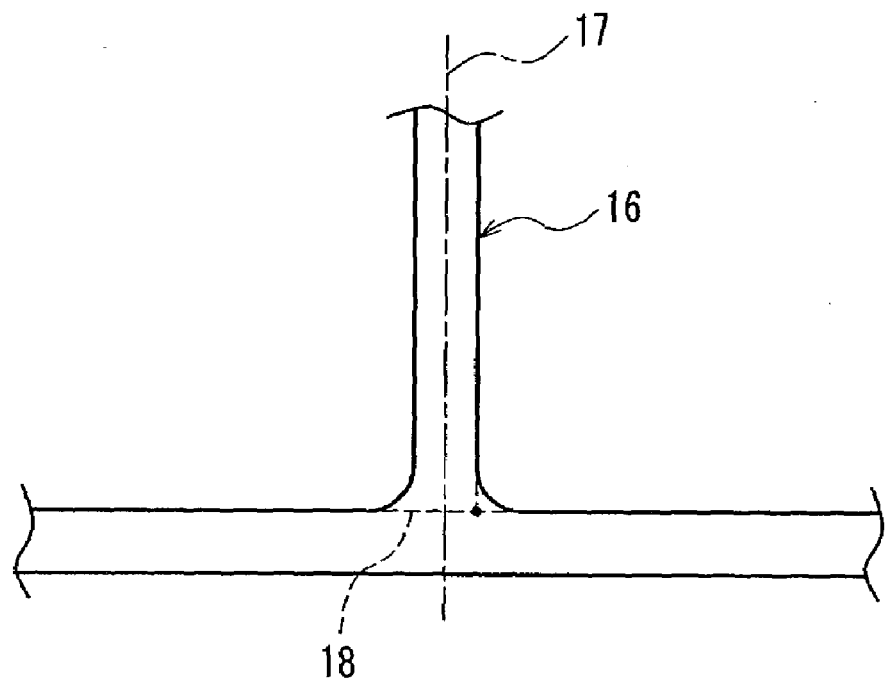
FIGS. 5A and 5B are plan views, each showing a resist pattern formed by the photomask according to Embodiment 1.
Figure 5B:
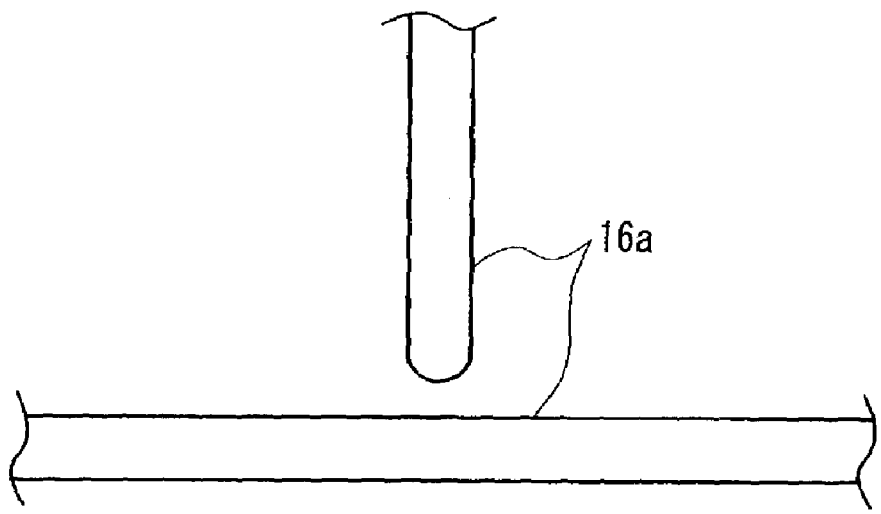
Figure 6:
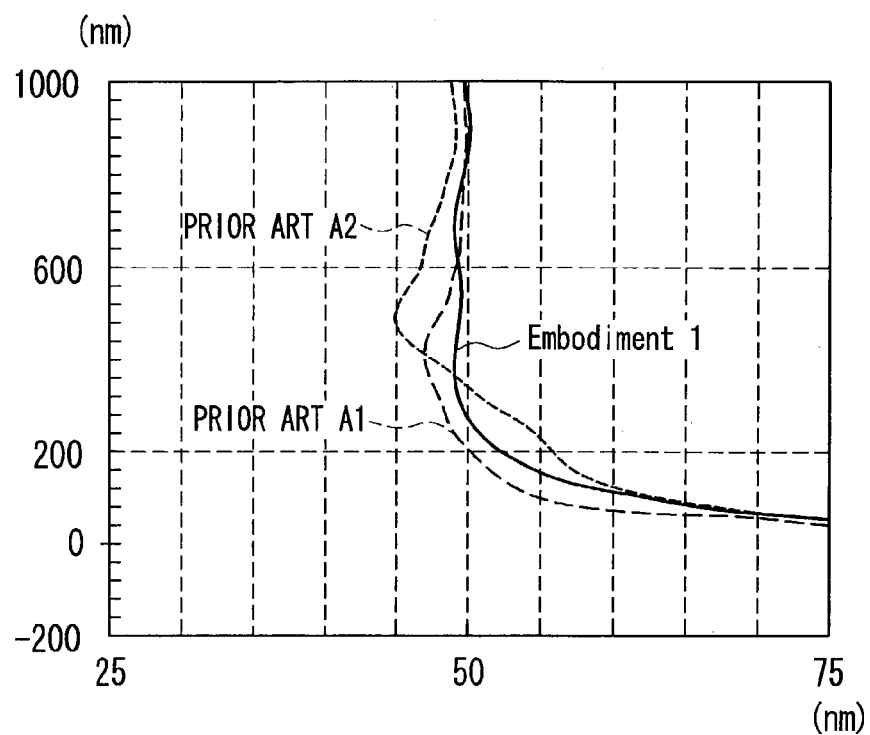
FIG. 6 is a graph showing a portion of the contour of a resist pattern formed according to Embodiment 1.

Embodiment 1 will be described by referring to FIGS. 4A and 4B, FIGS. 5A and 5B, and FIG. 6. FIGS. 4A and 4B are plan views, each showing pattern data used for forming a mask of this embodiment. In the pattern data of FIGS. 4A and 4B, a diagonally shaded region 10 corresponds to a light-shielding portion for shielding off-axis illumination light, and a plain region 11 corresponds to a light-transmitting portion for transmitting the off-axis illumination light. FIGS. 5A and 5B are plan views showing resist patterns formed by the mask based on the pattern data in FIGS. 4A and 4B, respectively. FIG. 6 is a graph showing a portion of the contour of the resist pattern formed by ⅔ annular illumination.

The pattern data of FIG. 4A includes a junction at which line circuit patterns 12, 13 (line width: about 100 nm) are connected to each other with the circuit pattern 12 being orthogonal to the circuit pattern 13 so as to form a T-shape. A rectangular small pattern 14 having a width of 5 nm and a length of 200 nm is formed on both sides of the circuit pattern 12 and one side of the circuit pattern 13. The small pattern 14 is provided within the range between 0.93 and 1.55 $\lambda/(NA \cdot K)$ (300 to 500 nm) of a distance from a neighboring side edge 15 of the other circuit pattern.

The pattern data of FIG. 4B includes a proximity portion at which line circuit patterns 12a, 13a (line width: about 100 nm) are located close to each other with the circuit pattern 12a being substantially orthogonal to the circuit pattern 13a so as to form a T-shape. A small pattern 14a similar to the small pattern 14 in shape is formed on both sides of the circuit pattern 12a and one side of the circuit pattern 13a. The small pattern 14a is provided within the range between 0.93 and 1.55 $\lambda/(NA \cdot K)$ (300 to 500 nm) of a distance from a neighboring side edge 15a of the other circuit pattern.

A Cr mask for an ArF excimer laser, which is a kind of binary mask, was produced according to the above pattern data. Using the Cr mask and an exposure apparatus that generates the ArF excimer laser, a circuit pattern was transferred onto a resist-coated semiconductor substrate by ⅔ annular illumination under the conditions of a transfer reduction ratio K= ¼ and a lens numerical aperture NA>0.6. Consequently, resist patterns 16, 16a with uniform line width were formed as shown in FIGS. 5A and 5B, which correspond to the pattern data of FIGS. 4A and 4B, respectively.

FIG. 6 shows the specific shape of a vertical line pattern in the vicinity of the junction of the resist pattern thus produced in comparison with conventional examples. The horizontal axis indicates a distance (nm) from a centerline 17 of the vertical line pattern of the resist pattern 16 in FIG. 5A. The vertical axis indicates a distance (nm) from an upper edge 18 of a horizontal line pattern of the resist pattern 16 in FIG. 5A. A conventional example A1 shows a case using the same mask and transfer conditions as those of this embodiment, except that no small pattern is formed. A conventional example A2 shows a case using a 5 nm-wide small pattern in the same manner as this embodiment, except that the small pattern is formed within the range between 0.4 and 0.75 $\lambda/(NA \cdot K)$ (125 to 250 nm).

As can be seen from FIG. 6, in the resist pattern of the conventional example A1, a constriction is generated at a distance of about 300 to 500 nm from the upper edge 18. Similarly, in the resist pattern of the conventional example A2, a constriction is generated at a distance of about 450 to 550 nm from the upper edge 18. However, this embodiment can eliminate the generation of constriction by forming a 5 nm-wide small pattern within the range between 300 and 500 nm (0.93 and 1.55 $\lambda/(NA \cdot K)$) of a distance from the upper edge 18.

The study conducted by the present inventors showed that the small pattern provided within the range between 0.79 and 1.8 $\lambda/(NA \cdot K)$ of a distance from the side edge 15 or 15a generally can suppress the generation of constriction satisfactorily. However, the small pattern provided within the range between 0.93 and 1.55 $\lambda/(NA \cdot K)$ can have a greater effect than that provided in the other ranges. For practical use, it is preferable to form the small pattern within the range between 0.79 to 1.55 $\lambda/(NA \cdot K)$.

When the small pattern is located farther away from the junction as compared with this embodiment, i.e., at a distance of more than 580 nm (1.80 $\lambda/(NA \cdot K)$) from the side edge 15 or 15a in FIG. 4A or 4B, the generation of constriction is not reduced. On the contrary, the region including the small pattern is made excessively thick.

The preferred width of a small pattern is in the range of 0.05W to 0.3W, where W represents the line width of a mask pattern that is determined according to a desired line width of a resist pattern. In other words, the dimensions of a wide portion including the small pattern can be given so that the amount of protrusion from the side edge of the pattern corresponding to a desired line width is 5% to 30% on one side of the pattern. When the amount of protrusion is less than 5%, the constriction cannot be reduced sufficiently for practical use. When the amount of protrusion is more than 30%, the line width of a region including the small pattern may be larger than a variation tolerance (generally, 10% or less).

This embodiment uses a mask in which a small pattern is formed at a predetermined portion of the mask pattern. Therefore, it is possible to eliminate effectively the constriction generated in part of a resist pattern after the transfer of a circuit pattern onto a semiconductor substrate by ⅔ annular illumination, thus making the line width uniform satisfactorily. Practically, the line width is considered to be uniform, if an error is within ±10% with respect to a desired line width.

Normal illumination or so-called weak annular illumination of about ½ annular ratio hardly causes the constriction that is generated at a distance of 300 to 500 nm (0.93 to 1.55 $\lambda/(NA \cdot K)$) from the neighboring side edge in the junction or the proximity portion. Accordingly, the effects of this embodiment are significant in using the ⅔ annular illumination.

Embodiment 2

Figure 7:
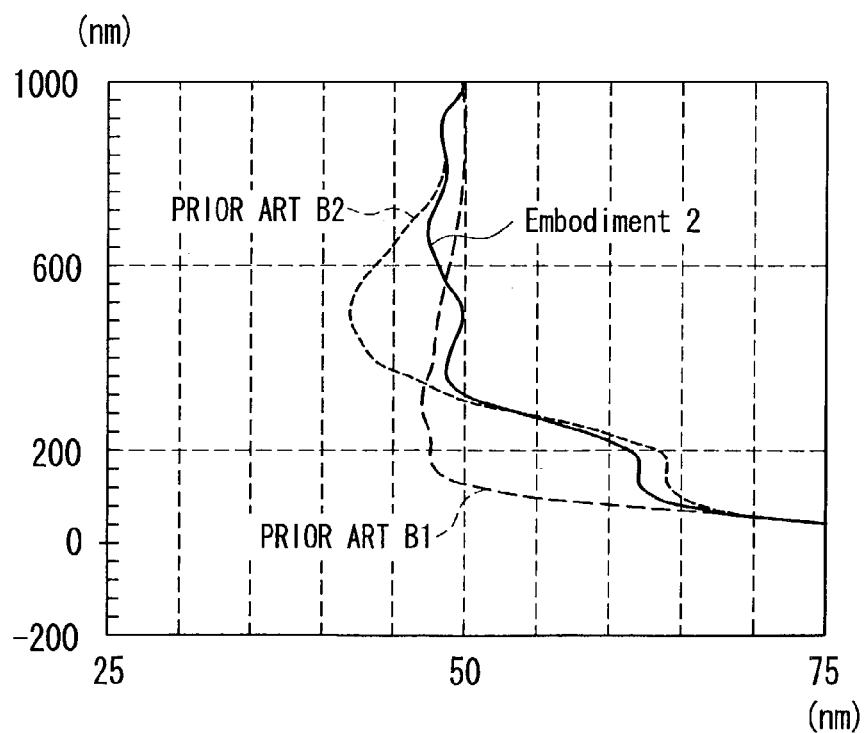
FIG. 7 is a graph showing a portion of the contour of a resist pattern formed according to Embodiment 2.

Embodiment 2 will be described by referring to FIG. 7. FIG. 7 is a graph showing a portion of the contour of a resist pattern formed by quadrupole illumination. In this embodiment, a mask including a 10 nm-wide small pattern was produced, and quadrupole illumination was used for exposure. The pattern etc. of the mask used are the same as those shown in FIGS. 4A, 4B, 5A, and 5B of Embodiment 1.

FIG. 7 shows the specific shape of a vertical line pattern in the vicinity of the junction of the resist pattern in comparison with conventional examples. The horizontal and vertical axes (nm) of this graph are the same as FIG. 6. A conventional example B1 shows a case using the same mask pattern and transfer conditions as those of this embodiment, except that no small pattern is formed. A conventional example B2 shows a case using a 10 nm-wide small pattern in the same manner as this embodiment, except that the small pattern is formed within the range between 0.4 and 0.75 $\lambda/(NA \cdot K)$ (125 to 250 nm).

As can be seen from FIG. 7, in the resist pattern of the conventional example B1, a constriction is generated at a distance of about 250 to 450 nm from the upper edge 18 of a horizontal line pattern. Similarly, in the resist pattern of the conventional example B2, a constriction is generated at a distance of about 350 to 650 nm from the upper edge 18. However, this embodiment can eliminate the generation of constriction by forming a 10 nm-side small pattern within the range between 250 and 450 nm (0.79 and 1.40 λ/(NA·K)) of a distance from the upper edge 18.

Like Embodiment 1, the study conducted by the present inventors showed that the small pattern provided within the range between 0.79 and 1.8 λ/(NA·K) of a distance from the side edge 15 or 15a generally can suppress the generation of constriction satisfactorily. However, the small pattern provided within the range between 0.79 and 1.40 λ/(NA·K) can have a greater effect than that provided in the other ranges.

When the small pattern is located farther away from the junction as compared with this embodiment, i.e., at a distance of more than 580 nm (1.80 λ/(NA·K)) from the side edge 15 or 15a in FIG. 4A or 4B, the generation of constriction is not reduced. On the contrary, the region including the small pattern is made excessively thick.

Like Embodiment 1, the preferred width of a small pattern is in the range of 0.05W to 0.3W, where W represents the line width of a mask pattern that is determined according to a desired line width of a resist pattern.

This embodiment uses a mask in which a small pattern is formed at a predetermined portion of the mask pattern. Therefore, it is possible to eliminate effectively the constriction generated in part of a resist pattern after the transfer of a circuit pattern onto a semiconductor substrate by quadrupole illumination, thus making the line width uniform satisfactorily.

Normal illumination or so-called weak annular illumination of about ½ annular ratio hardly causes the constriction that is generated at a distance of 250 to 450 nm (0.79 to 1.40 λ/(NA·K)) from the neighboring side edge in the junction or the proximity portion. Accordingly, the effects of this embodiment are significant in using the quadrupole illumination. The amount of constriction is larger for the quadrupole illumination than for the ⅔ annular illumination. Thus, in many cases, it is effective to increase the width of a small pattern.

In the above-mentioned configuration, e.g., in Embodiment 1, the small pattern is formed in the entire range between 0.93 and 1.55 λ/(NA·K) as an integral body. However, the small pattern is not limited thereto. Although the basic configuration of the present invention includes a small pattern provided within the range between 0.79 and 1.8 λ/(NA·K), part of the range can be free of the small pattern. Therefore, the small pattern may be arranged in a scattered manner instead of the integral body. In short, when the small pattern or patters are present in at least part of the above range, the constriction can be reduced appropriately. Moreover, there are some cases where the scattered small patterns are suitable, depending on the conditions.

When the small pattern is formed in part of the range, it is preferable that the small pattern occupies at least 70% of the range between 0.93 and 1.4 λ/(NA·K) in the length direction. For a practical purpose, this can provide substantially the same effect as that obtained when the small pattern is formed in the entire range.

Figure 8:
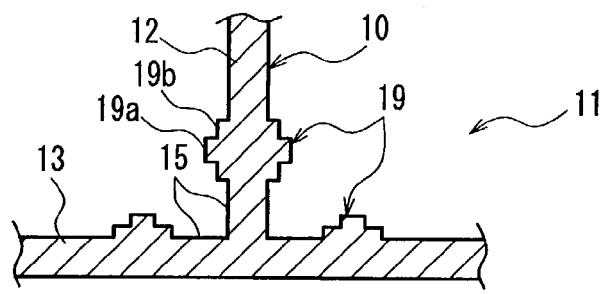
FIG. 8 is a plan view showing pattern data used for producing a photomask that is modified in shape according to the embodiments of the present invention.
Figure 9:
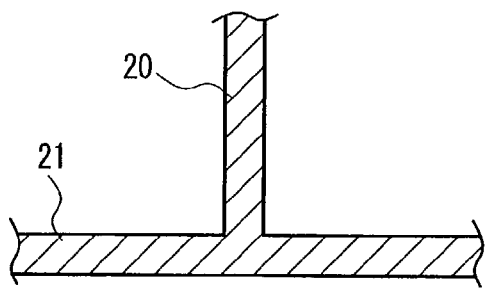
FIG. 9 is a plan view showing a conventional mask pattern.
Figure 10:
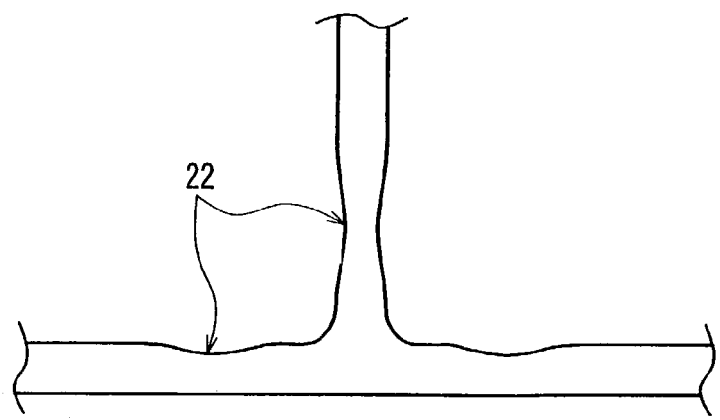
FIG. 10 is a plan view showing a resist pattern formed by the conventional mask pattern.

In the above embodiments, the wide portion formed by addition of the small pattern has a uniform width. As shown in FIG. 8, the small pattern also can be formed to make a difference in width of the wide portion. The line width of the wide portion 19 may be larger in the middle 19a than on both sides 19b thereof in the length direction of the circuit patterns 12, 13, thus providing a stepped portion.

When the line width of a resist pattern formed by transfer is about 100 nm as shown in Embodiments 1, 2, it is preferable to use an ArF excimer laser as off-axis illumination. Moreover, a KrF excimer laser is preferred for a resist pattern having a line width of about 150 nm, and a F2 laser also can be used for a resist pattern having a line width of 50 to 150 nm.

In Embodiments 1, 2, the transfer reduction ratio K=¼. However, as long as the transfer reduction ratio generally ranges from ⅕ to ¼, a resist pattern with satisfactorily uniform line width can be formed easily and stably on a semiconductor substrate.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for forming a resist pattern on a semiconductor substrate, comprising:

using a photomask having a mask pattern including a junction at which two line patterns are connected to each other with one line pattern being orthogonal to the other line pattern so as to form a T-shape, or a proximity portion at which two line patterns are located close to each other with one line pattern being substantially orthogonal to the other line pattern so as to form a T-shape, wherein a small pattern is formed on a side edge of the line pattern in the vicinity of the junction or the proximity portion so as to form a wide portion of the line pattern, the small pattern being provided within a range between 0.79 and 1.8 λ/(NA·K) of a distance from a neighboring side edge of the other line pattern, where λ is a wavelength of exposure illumination light, NA is a numerical aperture of a lens used, and K is a transfer reduction ratio; and transferring the mask pattern of the photomask onto a photoresist on the semiconductor substrate with the transfer reduction ratio K ranging from ⅕ to ¼, wherein the photomask is irradiated with off-axis illumination light during the transfer of the mask pattern, and annular light with an annular ratio of not more than ⅔ or quadrupole is used as the off-axis illumination light.

2. The method according to claim 1, wherein a circuit pattern formed on the semiconductor substrate has a line width of 50 nm to 150 nm.

* * * * *